(12) United States Patent
Yen

(10) Patent No.: US 8,661,301 B1
(45) Date of Patent: Feb. 25, 2014

(54) METHOD FOR DODGING BAD PAGE AND BAD BLOCK CAUSED BY SUDDENLY POWER OFF

(75) Inventor: Chi Nan Yen, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 39 days.

(21) Appl. No.: 13/607,646

(22) Filed: Sep. 7, 2012

(51) Int. Cl.
*G11C 29/00* (2006.01)
*G06F 13/00* (2006.01)
*G06F 9/34* (2006.01)
*G06F 1/00* (2006.01)

(52) U.S. Cl.
USPC ............ 714/723; 711/103; 711/201; 713/300

(58) Field of Classification Search
USPC ......... 714/718, 723, 773–774, 763, 752, 746, 714/699, 6.1, 6.11, 6.12, 6.13, 6.24, 14, 24, 714/48, 52; 713/300, 310, 320, 324; 711/100, 103–105, 111–113, 143, 711/200–202, 205–206, 221
See application file for complete search history.

(56) References Cited

U.S. PATENT DOCUMENTS

| 7,711,923 B2 * | 5/2010 | Rogers et al. ................. 711/206 |
| 8,185,685 B2 * | 5/2012 | Selinger ........................ 711/103 |
| 2011/0131365 A1 * | 6/2011 | Zhang et al. ................... 711/103 |

* cited by examiner

*Primary Examiner* — Christine Tu
(74) *Attorney, Agent, or Firm* — Che-Yang Chen; Law Office of Michael Chen

(57) ABSTRACT

A method for dodging bad page and bad block caused by suddenly power off is disclosed. This method is to avoid a new data from host program to potential hurt block or page caused by power off during NAND flash erasing or programming.

2 Claims, 8 Drawing Sheets

METHOD FOR DODGING BAD PAGE AND BAD BLOCK CAUSED BY SUDDENLY POWER OFF

FIELD OF THE INVENTION

The present invention provides a method for dodging bad page and bad block caused by suddenly power off.

BACKGROUND OF THE INVENTION

A storage device (such as NAND flash memory) may be powered off at any time. If the NAND flash memory is powered off during erasing, the erasing block may not be programmed directly even if this block looks like a good block. If the NAND flash memory is powered off during programming, the programming page may not be programmed again even if this page looks like non-program page. If the NAND flash memory is MLC (Multi-Level-Cell 2 bit/cell) and the programming page is a lower page (group A), its upper page (group B) may also cause new data crash. If the NAND flash memory is TLC (3 bit/cell) and the programming page is a lower page (group A or group B), its upper page (group B and group C) may also cause new data crash.

SUMMARY OF THE INVENTION

An objective of this invention is providing a method for dodging bad page and bad block caused by suddenly power off, which is capable of avoiding the data being broken caused by a host suddenly power off.

To achieve above objectives, a method for dodging bad page and bad block caused by suddenly power off is provided, wherein the type of the flash memory is single-level cell, and the steps of the method comprises:

step S11: searching a last programming page before a latest power-off and then allocating at least one free page for test after power on;

step S12: writing an original data to the free page for test if the original data is provided, or writing at least one specific pattern to the free page for test if the original data is not provided;

step S13: marking the free page for test as a used page;

step S14: reading back the used page and checking if there is an ECC error in the data of the used page;

step S15: if no, the data written to the used page is to change an address stored in a mapping table and the address is directing to a present page, or the specific pattern written to the used page is to skip the present page and start from next page to be used;

step S16: if yes, the used page is failed, and the original data and the address stored in the mapping table are kept and then next writing data starts from next page.

To achieve above objectives, a method for dodging bad page and bad block caused by suddenly power off is provided, wherein the type of the flash memory is multi-level cell or trinary-level cell, and the steps of the method comprises:

step S21: searching a last programming page before a latest power-off, allocating at least one free page for test after power on, and if the free page is not a LSB of a word line, the data of the LSB is backup;

step S22: writing an original data to the free page for test if the original data is provided, or writing at least one specific pattern to the free page for test if the original data is not provided;

step S23: marking the free page for test as a used page;

step S24: reading back the used page and checking if there is an ECC error in the data of the used page;

step S25: if no, the data written to the used page is to change an address stored in a mapping table and the address is directing to a present page, or the specific pattern written to the used page is to skip the present page and start from next page to be used;

step S26: if yes, checking if the used page is CSB (center significant bit) or MSB (most significant bit);

step S27: if no, back to step S21; if yes, further checking if an ECC of the data stored in a lower page is normal;

step S28: if yes, keeping a mapping table of the original data;

step S29: if no, the used page is broken and a data backup address is directed by the mapping table; and step S30: looping the step S29 to step S21 and ending until a last used page is the MSB of the initial used page.

Further features and advantages of the present invention will become apparent to those of skill in the art in view of the detailed description of preferred embodiments which follows, when considered together with the attached drawings and claims.

BRIEF DESCRIPTION OF THE DRAWINGS

All the objects, advantages, and novel features of the invention will become more apparent from the following detailed descriptions when taken in conjunction with the accompanying drawings.

DESCRIPTION OF THE PREFERRED EMBODIMENT

Figure 1A:
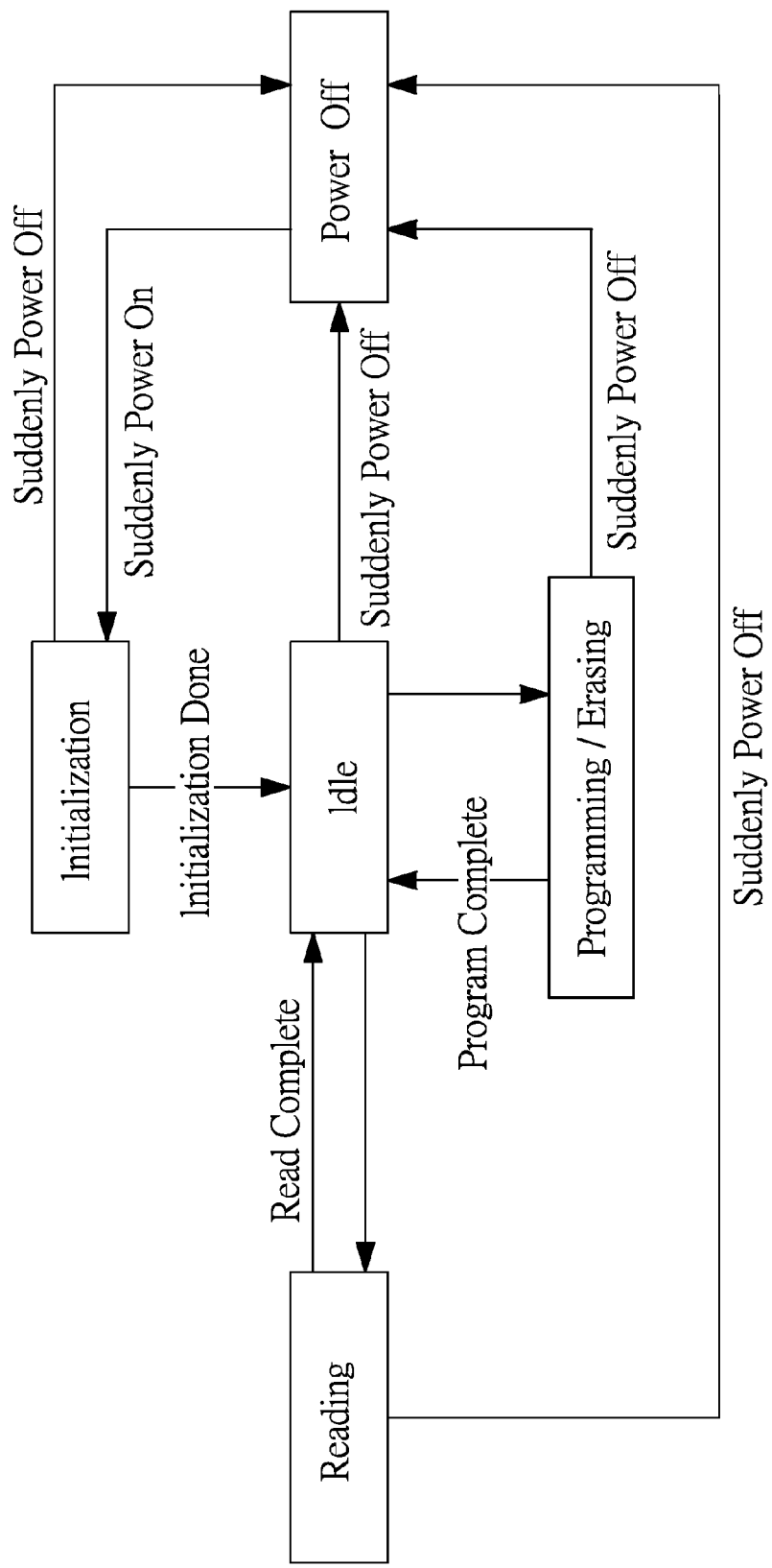
FIGS. 1A and 1B are two schematic diagrams showing the operating statuses of a flash memory device according to an embodiment of present invention.

Referring now to the drawings where like characteristics and features among the various figures are denoted by like reference characters.

Figure 1B:
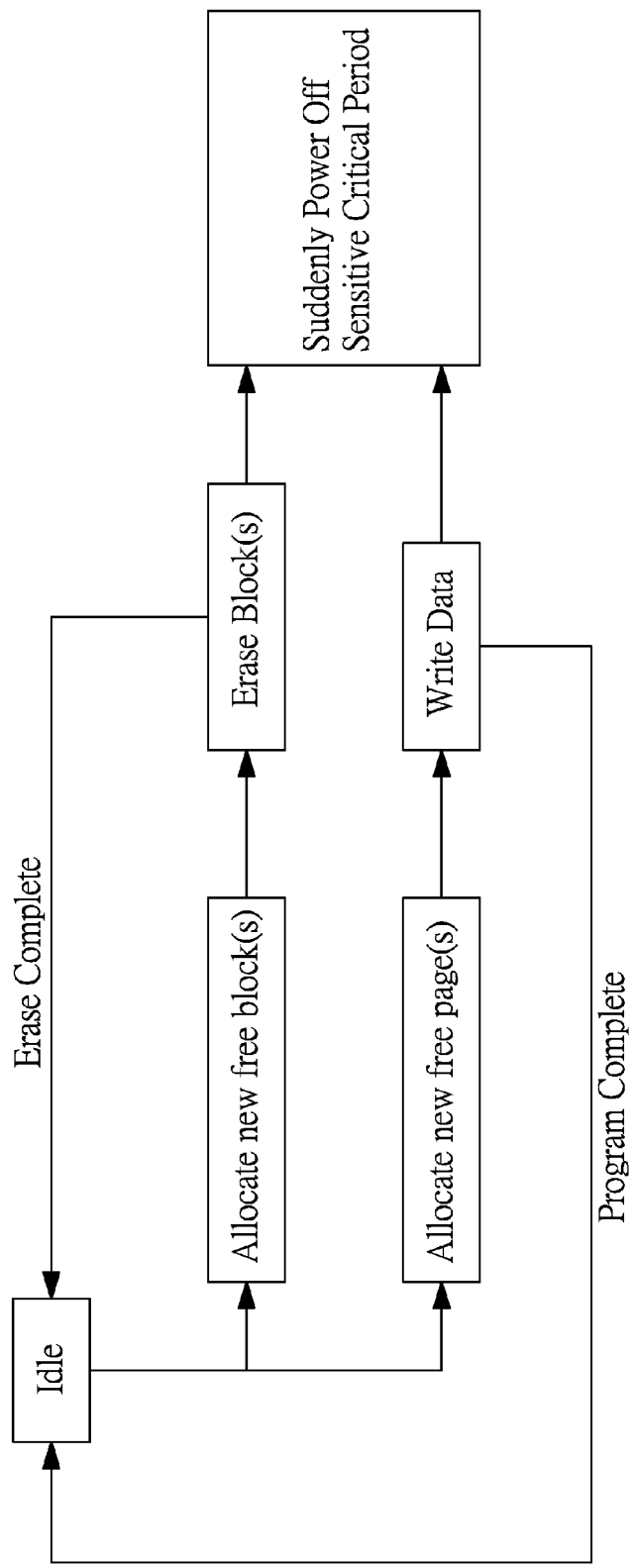

Please refer to FIGS. 1A and 1B, which are two schematic diagrams showing the operating statuses of a flash memory device according to an embodiment of present invention.

If a host is powered off during a NAND flash memory is erasing, the erasing block may not be programmed directly after power on even if this block all pages are clear. If a controller programs data to this block, the data may be broken. This block needs to be erased before the controller gets it to program to guarantee that the erase operation of the block is successful. If the host is powered off during the NAND flash memory is programming, the programming page may not be programmed again even if this page looks like non-program page. If the host data is programmed to this page directly, the data may be broken. After power on, the controller may check an acting block to search a free page address. The free page address maybe the programming page before power loss. The controller may program old data or meaningless data to the pages from free page address to avoid new data programming from the host to a potential hurt page. After programming the data to the free page address, the controller may read back and check ECC status. If the ECC status is failed, the controller may give up this page data and keep the old data in another block or page.

In one word, the critical problem is that the power-off is suddenly happened during the NAND flash memory is erasing or programming.

Figure 2:
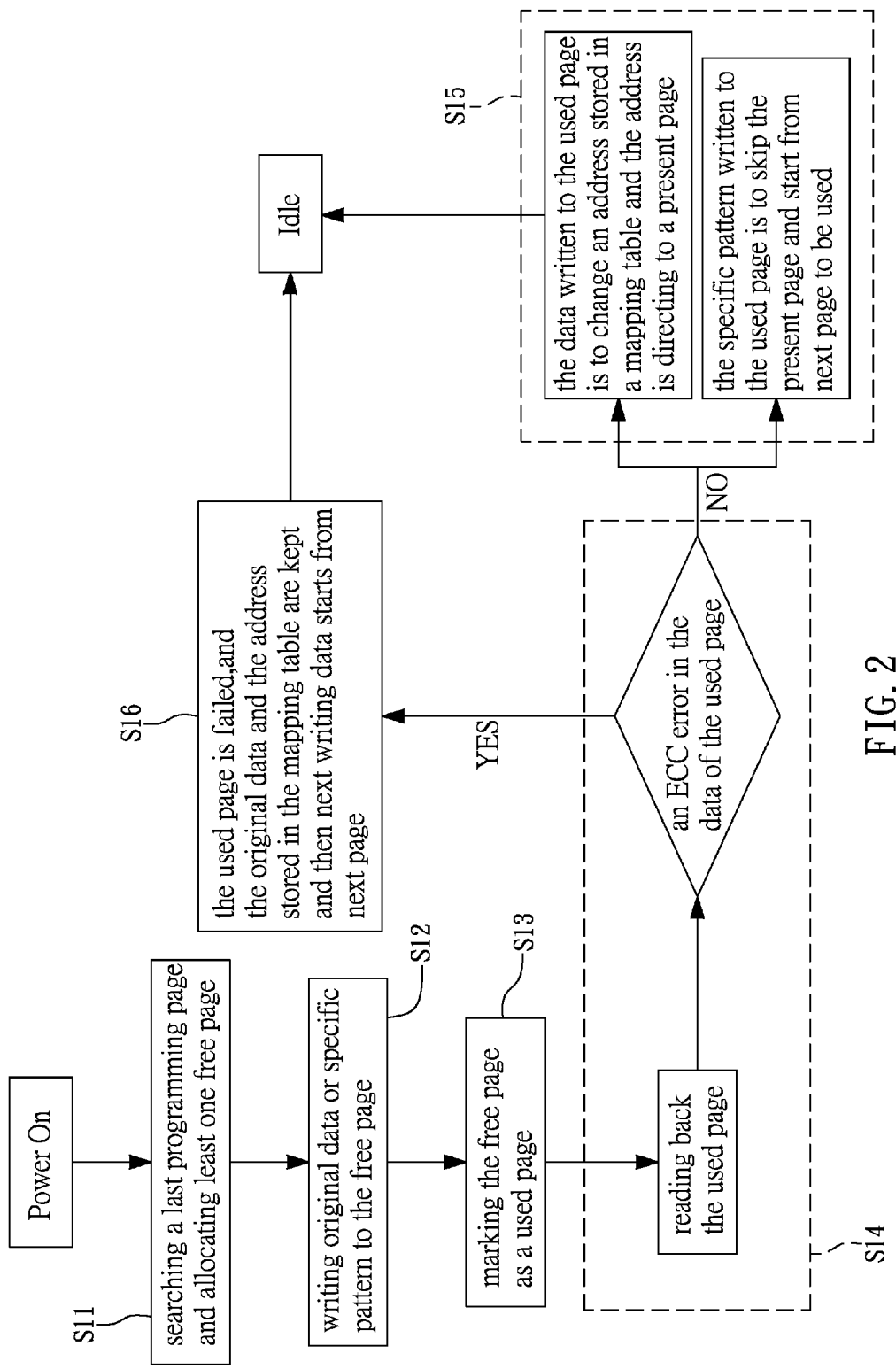
FIG. 2 is a detail flowchart showing a single level cell (SLC) dodging the page(s) interrupted by suddenly power off according to an embodiment of present invention.

Please refer to FIG. 2, which is a detail flowchart showing a single level cell (SLC) dodging the page(s) interrupted by suddenly power off according to an embodiment of present invention.

The detail steps for the process of a single level cell (SLC) dodging the page(s) interrupted by suddenly power off according to an embodiment of present invention are:

step S11: searching a last programming page before a latest power-off and then allocating at least one free page for test after power on;

step S12: writing an original data to the free page for test if the original data is provided, or writing at least one specific pattern to the free page for test if the original data is not provided;

step S13: marking the free page for test as a used page;

step S14: reading back the used page and checking if there is an ECC error in the data of the used page;

step S15: if no, the data written to the used page is to change an address stored in a mapping table and the address is directing to a present page, or the specific pattern written to the used page is to skip the present page and start from next page to be used;

step S16: if yes, the used page is failed, and the original data and the address stored in the mapping table are kept and then next writing data starts from next page.

Figure 3:
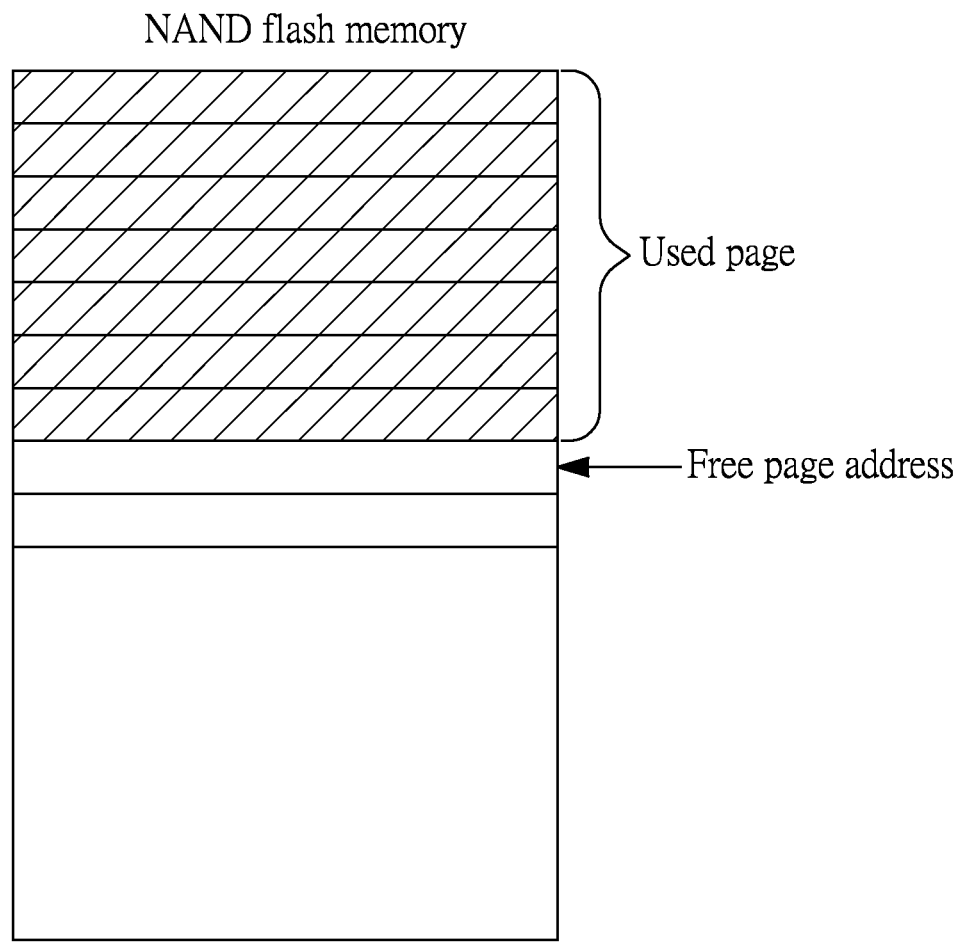
FIGS. 3 and 4 are an example of a single level cell (SLC) dodging the page(s) interrupted by suddenly power off in FIG. 2.
Figure 4:
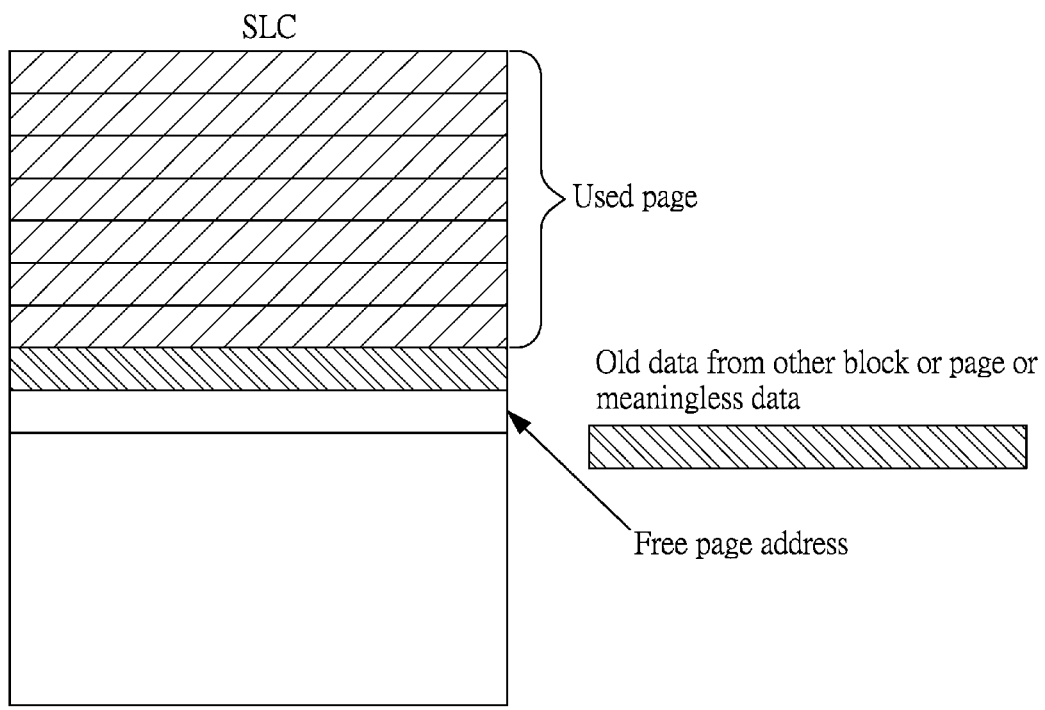

Please refer to FIGS. 3 and 4, which are an example of a single level cell (SLC) dodging the page(s) interrupted by suddenly power off in FIG. 2.

While controller get a free block first time after power on, controller need to erase this block before program data to this block to guarantee this block erase operation successfully. In FIG. 3, during initial flow, the controller may check an acting block before power off to search the address of the free page. After finding the address of the free page, the controller may program the old data or meaningless data to several pages from the address of the free page.

In FIG. 4, if the type of the flash memory is SLC (Single-Level-Cell), it may program the old data or meaningless data to the free page and the address of the free page is forward to next page. After programming the old data or meaningless data, it may read page back and check its ECC status. If the ECC status is failed and the data is the old data, it may keep the old data mapping to the original block or page.

Figure 5:
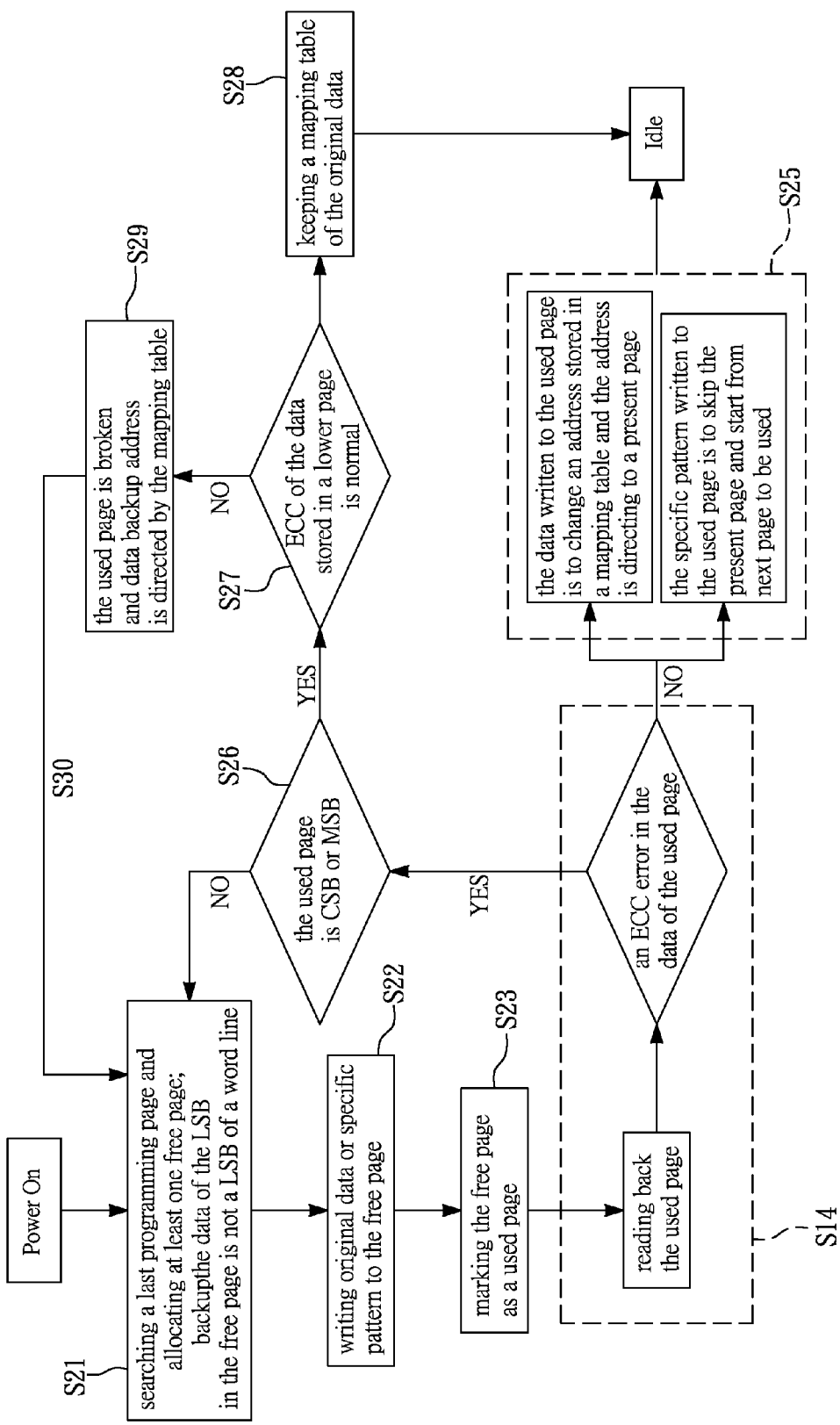
FIG. 5 is a detail flowchart showing a multi-level cell (MLC) or a trinary-level cell (TLC) dodging the page(s) interrupted by suddenly power off according to an embodiment of present invention.

Please refer to FIG. 5, which is a detail flowchart showing a multi-level cell (MLC) or a trinary-level cell (TLC) dodging the page(s) interrupted by suddenly power off according to an embodiment of present invention.

The detail steps for the process of a multi-level cell (MLC) or a trinary-level cell (TLC) dodging the page(s) interrupted by suddenly power off according to an embodiment of present invention are:

step S21: searching a last programming page before a latest power-off, allocating at least one free page for test after power on, and if the free page is not a LSB of a word line, the data of the LSB is backup;

step S22: writing an original data to the free page for test if the original data is provided, or writing at least one specific pattern to the free page for test if the original data is not provided;

step S23: marking the free page for test as a used page;

step S24: reading back the used page and checking if there is an ECC error in the data of the used page;

step S25: if no, the data written to the used page is to change an address stored in a mapping table and the address is directing to a present page, or the specific pattern written to the used page is to skip the present page and start from next page to be used;

step S26: if yes, checking if the used page is CSB (center significant bit) or MSB (most significant bit);

step S27: if no, back to step S21; if yes, further checking if an ECC of the data stored in a lower page is normal;

step S28: if yes, keeping a mapping table of the original data;

step S29: if no, the used page is broken and a data backup address is directed by the mapping table; and step S30: looping the S29 to step S21 and ending until a last used page is the MSB of the initial used page.

Figure 6:
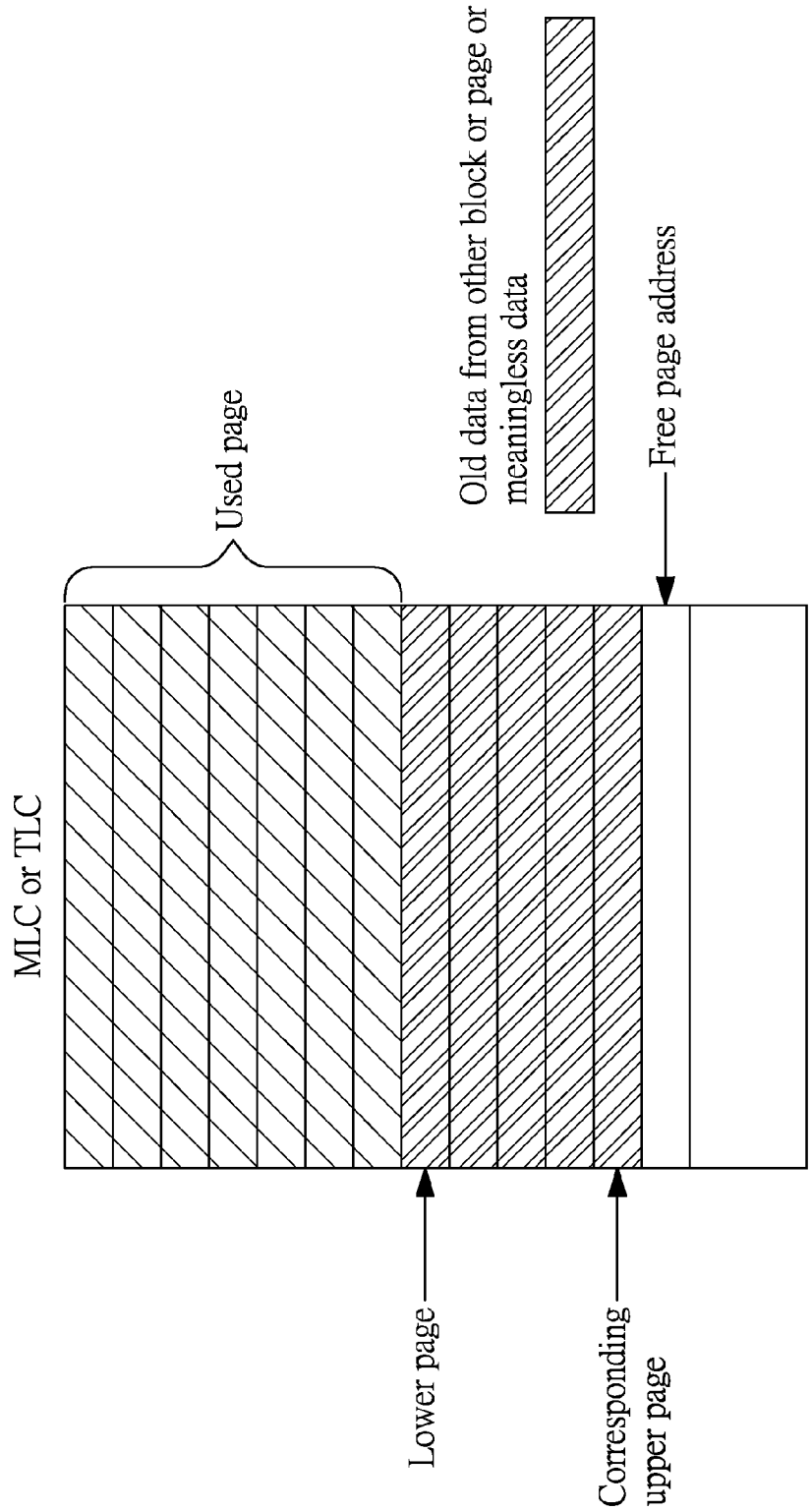
FIGS. 6 and 7 are an example of a multi-level cell (MLC) or a trinary-level cell (TLC) dodging the page(s) interrupted by suddenly power off in FIG. 5.
Figure 7:
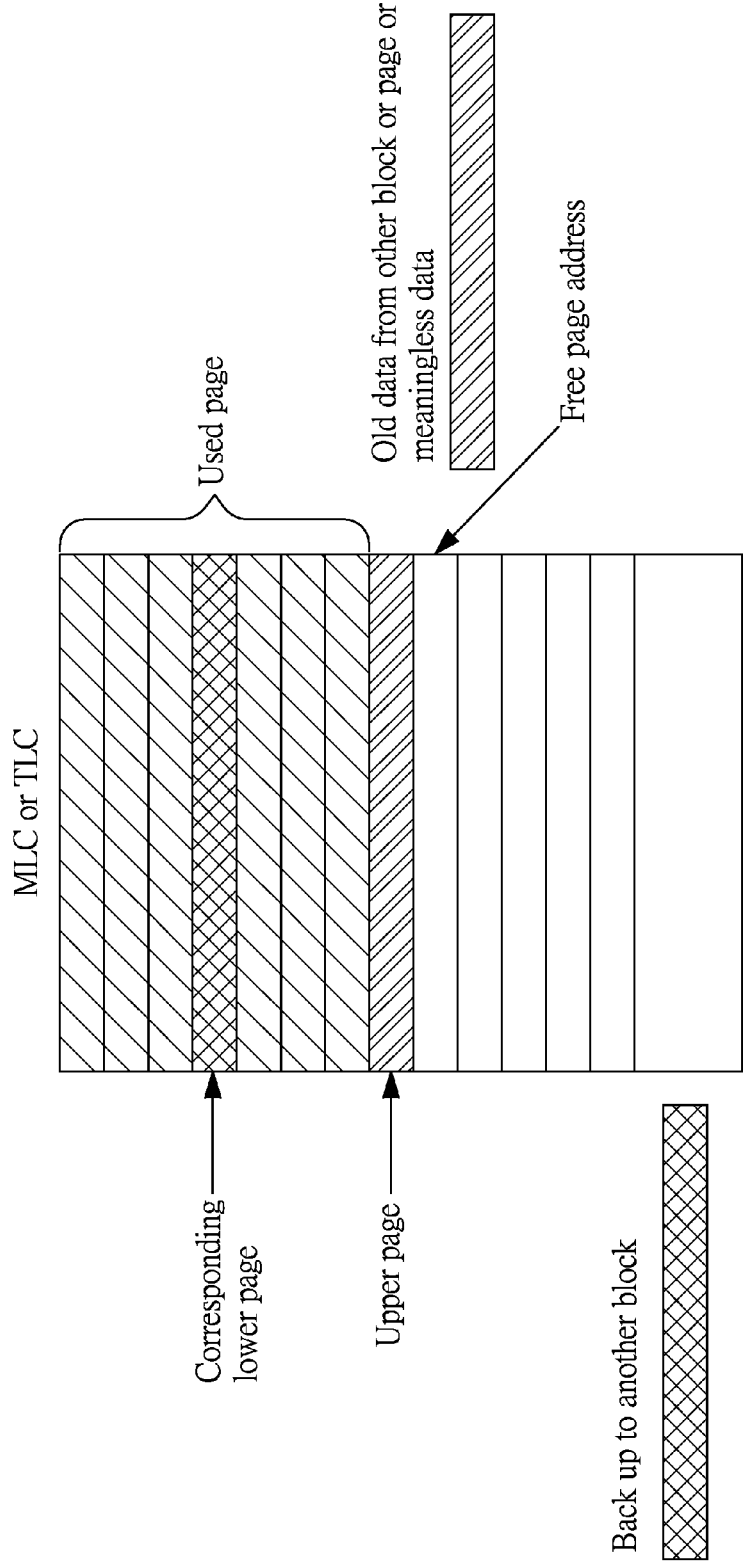

Please refer to FIGS. 6 and 7, which are an example of a multi-level cell (MLC) or a trinary-level cell (TLC) dodging the page(s) interrupted by suddenly power off in FIG. 5.

In FIG. 6, if the type of the flash memory is MLC or TLC and the free page address is lower page (group A), the old data or meaningless data is programmed to several pages based on the type of the flash memory and free page address. After programming old data or meaningless data, read pages back and check ECC status. If the ECC status is failed and the data is the old data, keep the old data mapping to the original block or page.

In FIG. 7, if the type of the flash memory is MLC or TLC and free page address is middle page (group B) or upper page (group C), while the controller is programming the old data or meaningless data to the free page, it is necessary to backup corresponding lower page data first because the data at the same word line may crash together. After programming old data or meaningless data to the free page, read free page and corresponding lower page back and check their ECC status. If the ECC status of the upper page (group C) is failed and the data is the old data, keep the old data mapping to the original block or page. If the ECC status of the corresponding lower page (group A) is failed, change mapping to the backup block.

It needs only do pre-erase action before the controller is programming it to avoid next data programmed to potential hurt block. It needs only several program and read operations to avoid next data programmed to potential hurt pages. It avoids user to read wrong data after power off during the flash memory is busy while erasing or programming.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method having steps for dodging bad page and bad block caused by suddenly power off, wherein the type of the flash memory is single-level cell, the steps comprising:

step S11: searching a last programming page before a latest power-off and then allocating at least one free page for test after power on;

step S12: writing an original data to the free page for test if the original data is provided, or writing at least one specific pattern to the free page for test if the original data is not provided;

step S13: marking the free page for test as a used page;

step S14: reading back the used page and checking if there is an ECC error in the data of the used page;

step S15: if there is no ECC error in the data of the used page, the data written to the used page is to change an address stored in a mapping table and the address is directing to a present page, or the specific pattern written to the used page is to skip the present page and start from next page to be used;

step S16: if there is any ECC error in the data of the used page, the used page is failed, and the original data and the address stored in the mapping table are kept and then next writing data starts from next page.

2. A method having steps for dodging bad page and bad block caused by suddenly power off, wherein the type of the flash memory is multi-level cell or trinary-level cell, the steps comprising:

step S21: searching a last programming page before a latest power-off, allocating at least one free page for test after power on, and if the free page is not a LSB of a word line, the data of the LSB is backup;

step S22: writing an original data to the free page for test if the original data is provided, or writing at least one specific pattern to the free page for test if the original data is not provided;

step S23: marking the free page for test as a used page;

step S24: reading back the used page and checking if there is an ECC error in the data of the used page;

step S25: if there is no ECC error in the data of the used page, the data written to the used page is to change an address stored in a mapping table and the address is directing to a present page, or the specific pattern written to the used page is to skip the present page and start from next page to be used;

step S26: if there is any ECC error in the data of the used page, checking if the used page is CSB (center significant bit) or MSB (most significant bit);

step S27: if the used page is not CSB nor MSB, back to step S21; if the used page is CSB or MSB, further checking if an ECC of the data stored in a lower page is normal;

step S28: if the ECC of the data stored in the lower page is normal, keeping a mapping table of the original data;

step S29: if the ECC of the data stored in the lower page is not normal, the used page is broken and a data backup address is directed by the mapping table; and step S30: looping the step S29 to the step S21 and ending until a last used page is the MSB of the initial used page.

* * * * *